(12) United States Patent
Yamazaki

(10) Patent No.: US 12,374,649 B2
(45) Date of Patent: Jul. 29, 2025

(54) SEMICONDUCTOR DEVICE, AND METHOD OF MANUFACTURING SEMICONDUCTOR DEVICE

(71) Applicant: Mitsubishi Electric Corporation, Tokyo (JP)

(72) Inventor: Koji Yamazaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 536 days.

(21) Appl. No.: 17/907,992

(22) PCT Filed: May 14, 2020

(86) PCT No.: PCT/JP2020/019178
§ 371 (c)(1),
(2) Date: Aug. 30, 2022

(87) PCT Pub. No.: WO2021/229733
PCT Pub. Date: Nov. 18, 2021

(65) Prior Publication Data
US 2023/0115289 A1 Apr. 13, 2023

(51) Int. Cl.
*H01L 23/00* (2006.01)

(52) U.S. Cl.
CPC ............ *H01L 24/73* (2013.01); *H01L 24/05* (2013.01); *H01L 24/06* (2013.01); *H01L 24/29* (2013.01); *H01L 24/32* (2013.01); *H01L 24/45* (2013.01); *H01L 24/48* (2013.01); *H01L 24/49* (2013.01); *H01L 24/71* (2013.01); *H01L 24/83* (2013.01); *H01L 24/85* (2013.01); *H01L 24/90* (2013.01); *H01L 24/92* (2013.01); *H01L 2224/05082* (2013.01); *H01L 2224/05155* (2013.01); *H01L 2224/05166* (2013.01);
(Continued)

(58) Field of Classification Search
CPC ...................................................... H01L 24/42
See application file for complete search history.

(56) References Cited

U.S. PATENT DOCUMENTS

| | | | | |
|---|---|---|---|---|
| 2015/0294940 A1* | 10/2015 | Fay | ...... | H01L 23/5386 257/777 |
| 2021/0035919 A1* | 2/2021 | Tsai | ...... | H01L 23/3121 |
| 2021/0167005 A1* | 6/2021 | Nakata | ...... | H01L 23/3121 |

FOREIGN PATENT DOCUMENTS

| | | |
|---|---|---|
| JP | 2011-176087 A | 9/2011 |
| JP | 2017-135183 A | 8/2017 |
| WO | 2012/077228 A1 | 6/2012 |

OTHER PUBLICATIONS

International Search Report and Written Opinion mailed on Jul. 21, 2020, received for PCT Application PCT/JP2020/019178, filed on May 14, 2020, 8 pages including English Translation.

* cited by examiner

*Primary Examiner* — Yu-Hsi D Sun
(74) *Attorney, Agent, or Firm* — XSENSUS LLP

(57) ABSTRACT

In a semiconductor device according to the present disclosure, one end and the other end of a plurality of insulation covering wires are joined to a connection region in an upper electrode of a DBC substrate over a semiconductor element while an insulation covering portion in a center region has contact with a surface of the semiconductor element. The plurality of insulation covering wires are provided along an X direction in the same manner as the plurality of metal wires. The plurality of insulation covering wires are provided with no loosening, thus have press force of pressing the semiconductor element in a direction of the solder joint portion.

9 Claims, 11 Drawing Sheets

(52) U.S. Cl.
CPC ............... *H01L 2224/05573* (2013.01); *H01L 2224/05624* (2013.01); *H01L 2224/05644* (2013.01); *H01L 2224/0603* (2013.01); *H01L 2224/06181* (2013.01); *H01L 2224/06505* (2013.01); *H01L 2224/29111* (2013.01); *H01L 2224/29116* (2013.01); *H01L 2224/29118* (2013.01); *H01L 2224/29139* (2013.01); *H01L 2224/29147* (2013.01); *H01L 2224/32227* (2013.01); *H01L 2224/45124* (2013.01); *H01L 2224/45147* (2013.01); *H01L 2224/45572* (2013.01); *H01L 2224/45624* (2013.01); *H01L 2224/45647* (2013.01); *H01L 2224/48106* (2013.01); *H01L 2224/48227* (2013.01); *H01L 2224/49111* (2013.01); *H01L 2224/49112* (2013.01); *H01L 2224/49175* (2013.01); *H01L 2224/71* (2013.01); *H01L 2224/73201* (2013.01); *H01L 2224/73251* (2013.01); *H01L 2224/73265* (2013.01); *H01L 2224/83011* (2013.01); *H01L 2224/83065* (2013.01); *H01L 2224/83075* (2013.01); *H01L 2224/83095* (2013.01); *H01L 2224/83192* (2013.01); *H01L 2224/83447* (2013.01); *H01L 2224/83815* (2013.01); *H01L 2224/85205* (2013.01); *H01L 2224/85447* (2013.01); *H01L 2224/90* (2013.01); *H01L 2224/92142* (2013.01); *H01L 2224/92247* (2013.01); *H01L 2924/0133* (2013.01); *H01L 2924/014* (2013.01); *H01L 2924/10272* (2013.01); *H01L 2924/20105* (2013.01); *H01L 2924/20107* (2013.01); *H01L 2924/2076* (2013.01)

| Δt(μm) | COMPARISON TECHNIQUE | EMBODIMENT 1 | EMBODIMENT 2 |
|---|---|---|---|
| 5 | GOOD | GOOD | GOOD |
| 8 | FAULT | GOOD | GOOD |
| 15 | FAULT | GOOD | GOOD |
| 33 | FAULT | GOOD | GOOD |
| 52 | FAULT | GOOD | GOOD |
| 78 | FAULT | GOOD | GOOD |
| 90 | FAULT | GOOD | GOOD |

SEMICONDUCTOR DEVICE, AND METHOD OF MANUFACTURING SEMICONDUCTOR DEVICE

CROSS-REFERENCE TO RELATED APPLICATION

The present application is based on PCT filing PCT/JP2020/019178, filed May 14, 2020, the entire contents of which are incorporated herein by reference.

TECHNICAL FIELD

The present disclosure relates to a semiconductor device having a configuration of connecting a semiconductor element to a substrate using solder and a method of manufacturing the semiconductor device.

BACKGROUND ART

Recently, demand for reliability on a semiconductor device increases more and more, and particularly required is improvement of lifetime reliability on a joining portion where a semiconductor element and a circuit substrate having a large difference of a thermal expansion coefficient are joined.

Conventionally, a semiconductor element including silicon (Si) or gallium arsenic (GaAs) as a constituent material is commonly used, and an operation temperature thereof is 100° C. to 125° C. Required as a solder member joining such a semiconductor element to a circuit substrate is a solder member satisfying a high melting point for dealing with multistage solder bonding in manufacture, a crack resistance property for repetitive thermal stress according to activation and suspending the semiconductor element, and pollution resistance of a device.

Used in response to such a demand is a solder member including 95Pb-5 Sn (percent by mass) in an Si device or 80Au-20Sn (percent by mass) in a gallium arsenic device as a constituent material, for example. However, 95Pb-5 Sn including a large amount of harmful lead (Pb) has a problem from a viewpoint of reduction in environmental load, and 80An-20 Sn including a large amount of noble metal has a problem from a viewpoint of rising noble metal price and an amount of deposit, thus necessity of an alternate material is strongly desired.

In the meanwhile, there is a tendency that a widegap semiconductor such as silicon carbide (SiC) is adopted as a next generation device for improving an output of a power semiconductor device and downsizing thereof to increase high current density and high operation temperature. Thus, high joint reliability is required in the solder joint portion below the semiconductor element.

As described in Patent Document 1, indicated is that a longitudinal crack occurs in a vertical direction in a solder joint portion in a power cycle test in which heat is generated in a semiconductor element by repetitively turning current on and off. Patent Document 1 discloses that a longitudinal crack width increases and a heat radiation property decreases after the longitudinal crack occurs, and a crack is developed from a fragile position of the solder joint portion, thereby causing a defect.

Adopted in a semiconductor device disclosed in Patent Document 2 is a retainer plate functioning as a press member to take measures against the longitudinal crack in the solder joint portion. In the semiconductor device described above, a solder joint thickness increases by a space in which the longitudinal crack occurs in the solder joint portion, thus the retainer plate presses the semiconductor element and an insulating substrate to be in contact with each other more firmly so that increase in the solder joint thickness is suppressed. The pressing function of the retainer plate described above limits the increase in the thickness of the solder between the insulating plate and the semiconductor element, thus the longitudinal crack in a center portion of the solder is suppressed.

In a semiconductor device disclosed in Patent Document 3, provided as a press member is a metal plate having contact with an upper surface side conductor connected to an upper surface electrode layer of a semiconductor element fixed on a direct bond copper (DBC) substrate. In the semiconductor device disclosed in Patent Document 3, the metal plate is connected to copper circuit foil of the DBC substrate for fixing the metal plate to press the upper surface side conductor in a direction of the semiconductor element. The semiconductor device describe above further includes a joint structure of fixing a frame body as a guide for positioning the semiconductor element and the upper surface side conductor on the DBC substrate.

PRIOR ART DOCUMENTS

Patent Documents

Patent Document 1: International Publication No. 2012/077228
Patent Document 2: Japanese Patent Application Laid-Open No. 2017-135183
Patent Document 3: Japanese Patent Application Laid-Open No. 2011-176087

SUMMARY

Problem to be Solved by the Invention

The structure of providing the press member for pressing the solder joint portion disclosed in Patent Document 2 and Patent Document 3 is an effective means to suppress the longitudinal crack occurring in the solder joint portion below the semiconductor element in the power cycle test described in Patent Document 1. That is to say, the retainer plate is adopted in the semiconductor device disclosed in Patent Document 2 and the metal plate is adopted in the semiconductor device disclosed in Patent Document 3 as the press member.

Generally, it is difficult to uniformly form a thickness of the solder joint portion, and it is often the case that a film thickness of the solder joint portion is not uniform. When the solder joint portion is pressed using the press member via the semiconductor element in the semiconductor device having the solder joint portion having the non-uniform film thickness, a partial contact state in which one side of the semiconductor element is pressed occurs. Thus, it is difficult to stably press the solder joint portion in the semiconductor device having the solder joint portion with the non-uniform film thickness.

Herein, in occurrence of the partial contact state, a region in the semiconductor element sufficiently pressed by the press member is referred to as an appropriate press region, and a region in the semiconductor element insufficiently pressed by the press member is referred to as an inappropriate press region.

In the above case, the longitudinal crack occurs in a region in the solder joint portion below the inappropriate press region in the semiconductor element and a solder joint thickness excessively increases. As a result of extreme reduction of a heat radiation property of the solder joint portion, such a case has a problem that there is a high possibility that the semiconductor element itself is broken at the time of power cycle test.

Furthermore, in a case of the metal plate adopted in the semiconductor device disclosed in Patent Document 3, when a surface of the metal plate is rough, contact resistance is not stable in a point connection state at a time of current conduction, and an excessive heating portion locally occurs due to current conduction at the time of power cycle test, thereby causing a joint defect.

In addition, in the semiconductor device having the press member, there is a problem that the retainer plate and the metal plate is additionally provided, thus a size of a joint structure part including the press member in the semiconductor device increases, and a size as a power module increases.

An object of the present disclosure is to solve the above problems, achieve downsizing of a device, and provide a semiconductor device capable of securing joint reliability in a solder joint portion.

Means to Solve the Problem

A semiconductor device according to the present disclosure includes: a substrate; and a semiconductor element provided on the substrate via a solder joint portion, wherein the substrate and the semiconductor element are joined by the solder joint portion, the semiconductor device further includes: a metal wire including one end connected to the semiconductor element and another end connected to the substrate; and an insulation covering wire including a wire portion and an insulation covering portion provided to cover the wire portion, provided independently from the metal wire, and having one end and another end connected to the substrate over the semiconductor element, wherein the insulation covering wire is provided in a form that the insulation covering portion has contact with a surface of the semiconductor element, and has press force of pressing the semiconductor element in a direction of the solder joint portion.

Effects of the Invention

The insulation covering wire in the semiconductor device according to the present disclosure has the press force of pressing the semiconductor element in the direction of the solder joint portion.

Thus, the semiconductor device according to the present disclosure has an effect that increase in a film thickness caused by a longitudinal crack of a solder joint portion can be suppressed. This effect can effectively suppress a defect of occurrence of heat generation phenomenon in the semiconductor element when a film thickness of the solder joint portion is not uniform.

As a result, the semiconductor device according to the present disclosure is capable of securing high joint reliability in the solder joint portion.

The insulation covering wire has a structure that the insulating covering portion covers an outer periphery of the wire portion. Thus, even when the insulation covering wire has contact with a surface of the semiconductor element, the semiconductor element and the wire portion are not electrically connected to each other.

Accordingly, in the semiconductor device according to the present disclosure, the insulation covering wire does not have an influence on an operation of the semiconductor element.

In addition, the insulation covering wire having the wire portion and the insulation covering portion is a relatively small constituent element, thus the semiconductor device according to the present disclosure can achieve downsizing of the device.

These and other objects, features, aspects and advantages of the present disclosure will become more apparent from the following detailed description when taken in conjunction with the accompanying drawings.

DESCRIPTION OF EMBODIMENT(S)

Embodiment 1

Figure 1:
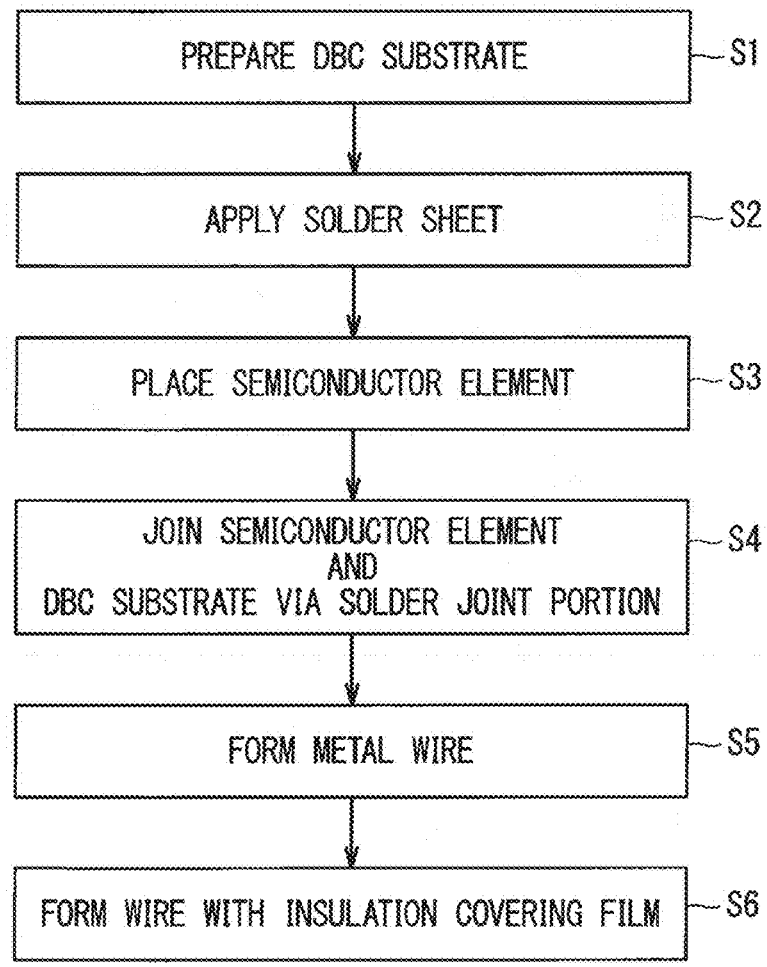
FIG. 1 A flow chart illustrating a method of manufacturing a semiconductor device according to an embodiment 1.

FIG. 1 is a flow chart illustrating a method of manufacturing a semiconductor device 51 as an embodiment 1 of the present disclosure. FIG. 2 to FIG. 13 are explanation diagrams each illustrating a method of manufacturing the semiconductor device 51 according to an embodiment 2. FIG. 2, FIG. 4, FIG. 6, FIG. 8, FIG. 10, and FIG. 12 are cross-sectional views, and FIG. 3, FIG. 5, FIG. 7, FIG. 9, FIG. 11, and FIG. 13 are plan views. An XYZ rectangular coordinate system is illustrated in FIG. 2 to FIG. 13. A manufacturing process of the semiconductor device 51 is described hereinafter with reference to these drawings.

Figure 2:
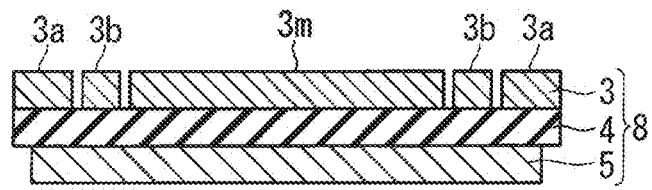
FIG. 2 An explanation diagram illustrating the method of manufacturing the semiconductor device according to the embodiment 1.
Figure 2:
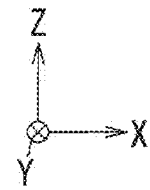
Figure 3:
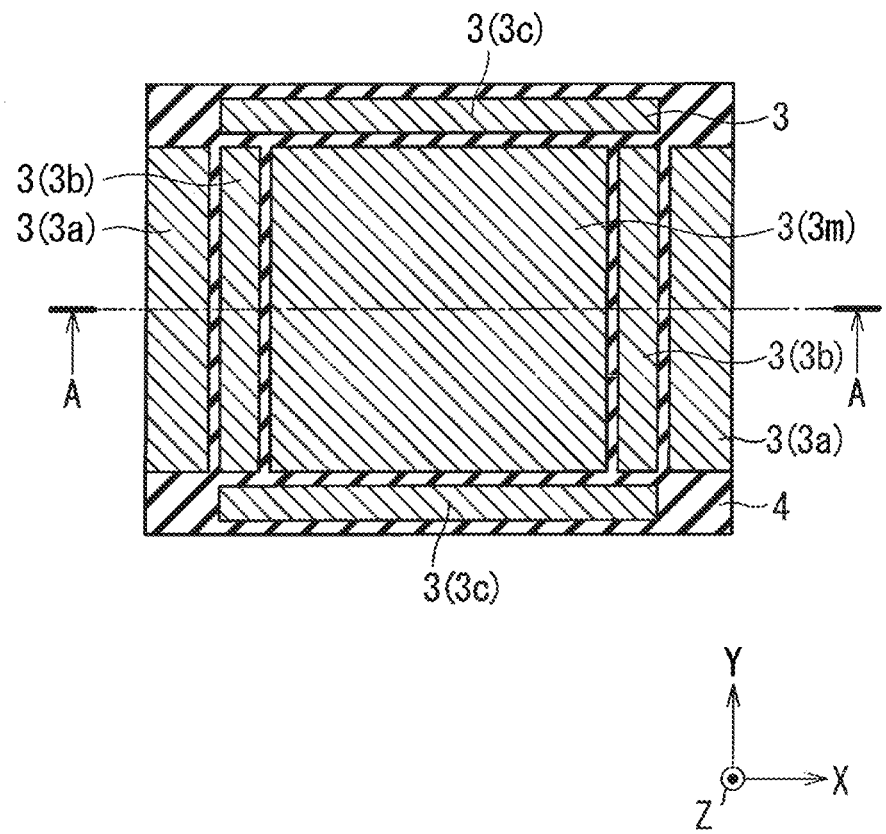
FIG. 3 An explanation diagram illustrating the method of manufacturing the semiconductor device according to the embodiment 1.

Firstly, in Step S1, a direct bonded copper (DBC) substrate 8 is prepared as illustrated in FIG. 2 and FIG. 3. FIG. 2 corresponds to an A-A cross section in FIG. 3.

The DBC substrate 8 as a substrate for a semiconductor element 1 includes an upper electrode 3, an insulation base body 4, and a lower electrode 5 as main constituent elements. The upper electrode 3 is provided on an upper surface of the insulation base body 4, and the lower electrode 5 is provided on a lower surface of the insulation base body 4.

The insulation base body 4 includes silicon nitride ($Si_3N_4$) as a constituent material, and has a film thickness of 0.32 mm. The upper electrode 3 includes copper (Cu) as a constituent material, and has a film thickness of 0.4 mm.

The lower electrode 5 has a structure of attaching three layers (Cu/$Si_3N_4$/Cu), and has a film thickness of 0.4 mm. Considered as a method of attaching the three layers constituting the lower electrode 5 is direct bonding by anchor effect using a surface roughening technique or joining by a hard solder material. For example, Ag solder, Cu solder, Al solder, and Zn solder are considered as the hard solder material.

A pattern including main region 3m and a connection region 3a to 3c is formed as the upper electrode 3 of the DBC substrate 8. Considered as a method of forming the pattern described above are a first method of performing a desired patterning on the upper electrode 3 firstly, and then attaching the upper electrode 3 to the insulation base body 4 using a jig, for example, or a second method of attaching a constituent material of the upper electrode 3 to the insulation base body 4, and then performing patterning on the upper electrode 3 by etching.

The patterned upper electrode 3 includes a main region 3m and connection regions 3a to 3c. The main region 3m serves as a solder joint region joined to the semiconductor element 1 via a solder joint portion 2 described hereinafter.

The connection region 3a and the connection region 3b are electrically independent from each other, and the connection region 3a and the connection region 3c are electrically independent from each other between the connection regions 3a to 3c. In the connection regions 3a to 3c, the connection region 3a is classified into a first connection region electrically connected to an external terminal for actual use, and the connection regions 3b and 3c are classified into second connection regions for joining an insulation covering wire 7 and an insulation covering wire 17 described hereinafter.

Accordingly, the connection region 3b and the connection region 3c classified into the second connection regions are not electrically connected to the external terminal for actual use, and current does not flow in the insulation covering wire 7 and the insulation covering wire 17 described hereinafter.

Figure 4:
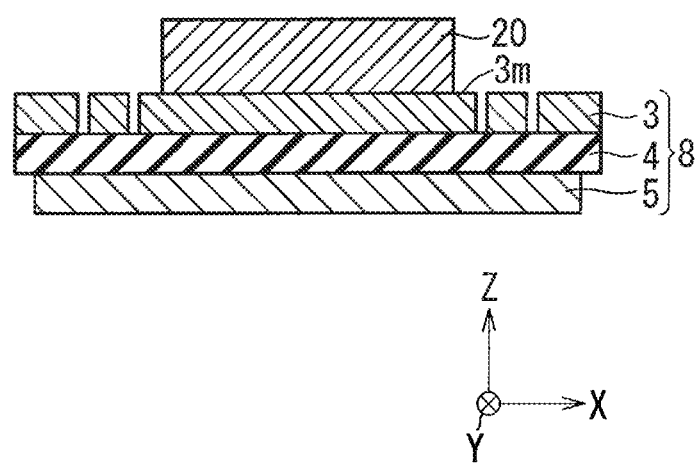
FIG. 4 An explanation diagram illustrating the method of manufacturing the semiconductor device according to the embodiment 1.
Figure 5:
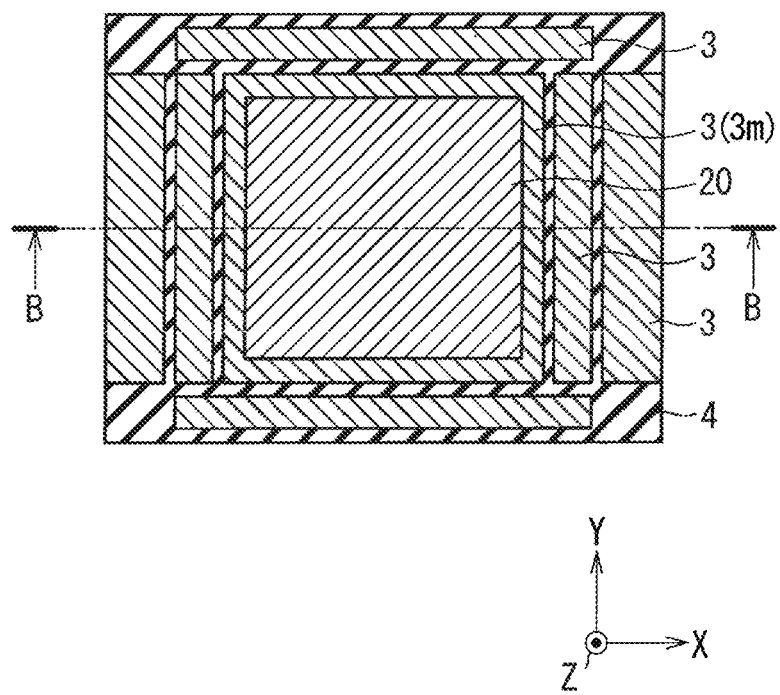
FIG. 5 An explanation diagram illustrating the method of manufacturing the semiconductor device according to the embodiment 1.

Next, a solder sheet 20 is disposed on the DBC substrate 8 as illustrated in FIG. 4 and FIG. 5 in Step S2. FIG. 4 corresponds to a B-B cross section in FIG. 5.

The solder sheet 20 is disposed on the main region 3m in the upper electrode 3, and has a size dimension in which a film thickness of 100 μm and a size in a plan view in an XY plane is slightly larger than 10 mm×10 mm. The solder sheet 20 becomes a solder member as the solder joint portion 2 in the future.

In the present embodiment, Sn-3Ag-0.5Cu as general-purpose lead-free solder is adopted as a component of the solder sheet 20. In "Sn-3Ag-0.5Cu", a percent by mass of Sn, Ag, and Cu is Sn: 96.5%, Ag: 3.0%, and Cu: 0.5%.

Herein, a form of the solder needs not be a sheet, however, solder paste is also applicable. That is to say, solder paste may be disposed on the upper electrode 3 of the DBC substrate 8 in place of the solder sheet 20. In a case of the solder paste, the solder member is considered to be formed using a metal mask printing technique or a flat dispensing supply system.

A component including Sn as a main component and optionally and additionally including the other metal (Ag, Cu., Sb, Ni, Fe, Al, Ti, or Zn, for example) is also applicable as a component of the solder sheet 20 or the solder member including solder paste. Furthermore, Zn may be applied as a main component of the solder member although a joint temperature is high, and Pb may also be applied as a main component of the solder member as long as it is used for manufacturing a member which is not subject to restriction on hazardous substances (RoHs).

Figure 6:
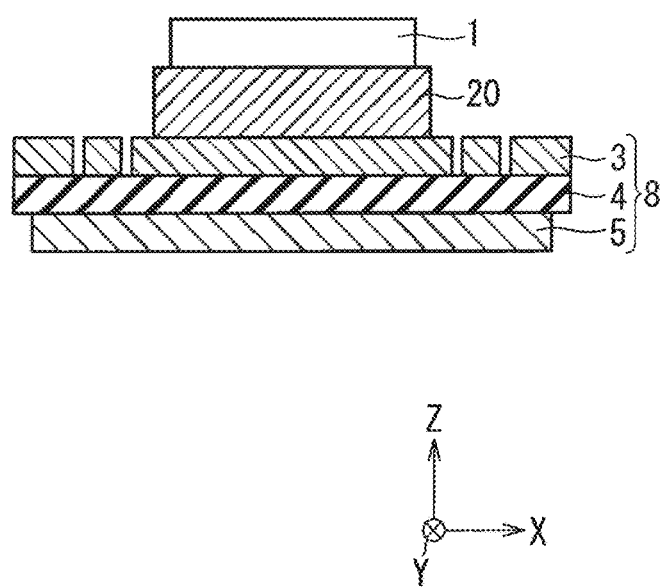
FIG. 6 An explanation diagram illustrating the method of manufacturing the semiconductor device according to the embodiment 1.
Figure 7:
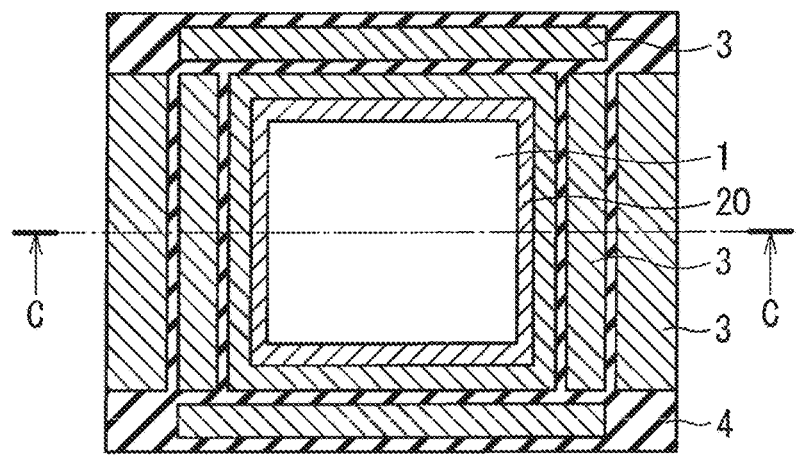
FIG. 7 An explanation diagram illustrating the method of manufacturing the semiconductor device according to the embodiment 1.
Figure 7:
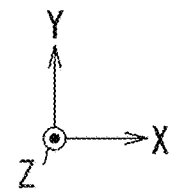

Subsequently, the semiconductor element 1 is disposed on the solder sheet 20 as illustrated in FIG. 6 and FIG. 7 in Step S3. FIG. 6 corresponds to a C-C cross section in FIG. 7.

The semiconductor element 1 has a film thickness of 0.3 mm and a size of 10 mm×10 mm in a plan view in an XY plane. A constituent material of the semiconductor element 1 is SiC.

A rear surface of the semiconductor element 1 serves as a joint surface joined to the solder sheet 20, and a rear surface metal film not shown in the drawings is formed on the rear surface of the semiconductor element 1. This rear surface metal film is formed in an order of Ti 50 nm/Ni 700 nm/Au 200 nm toward a −Z direction.

A front surface of the semiconductor element 1 is a joint surface joined to a plurality of metal wires 6 described hereinafter. A front surface metal film not shown in the drawings is formed on a front surface of the semiconductor element 1. A15 μm is formed as the front surface metal film. Xddnm means that a constituent material is X and a film thickness is dd (nm) in the rear surface metal film and the front surface metal film.

Herein, in a case where the semiconductor element 1 is disposed on the solder sheet 20, when a general-purpose chip mounter is used, the semiconductor element 1 can be accurately mounted on the solder sheet 20. It is also applicable that, to suppress a positional deviation at the time of mounting the semiconductor element 1, the semiconductor element 1 is pressed in the solder sheet 20 by a chip mounter heated to have a temperature lower than 220° C. as a melting point of solder, that is 175° C., for example, and placing and temporarily fixing the semiconductor element 1 on the solder sheet 20.

Figure 8:
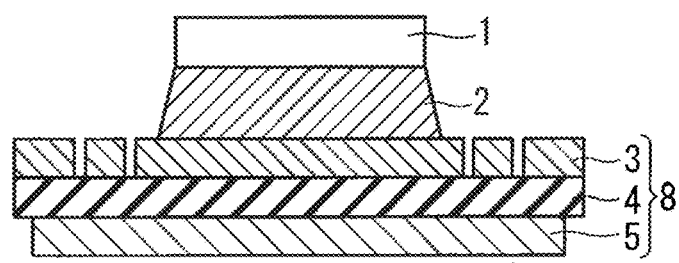
FIG. 8 An explanation diagram illustrating the method of manufacturing the semiconductor device according to the embodiment 1.
Figure 8:
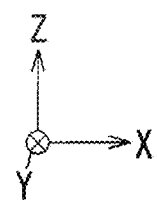
Figure 9:
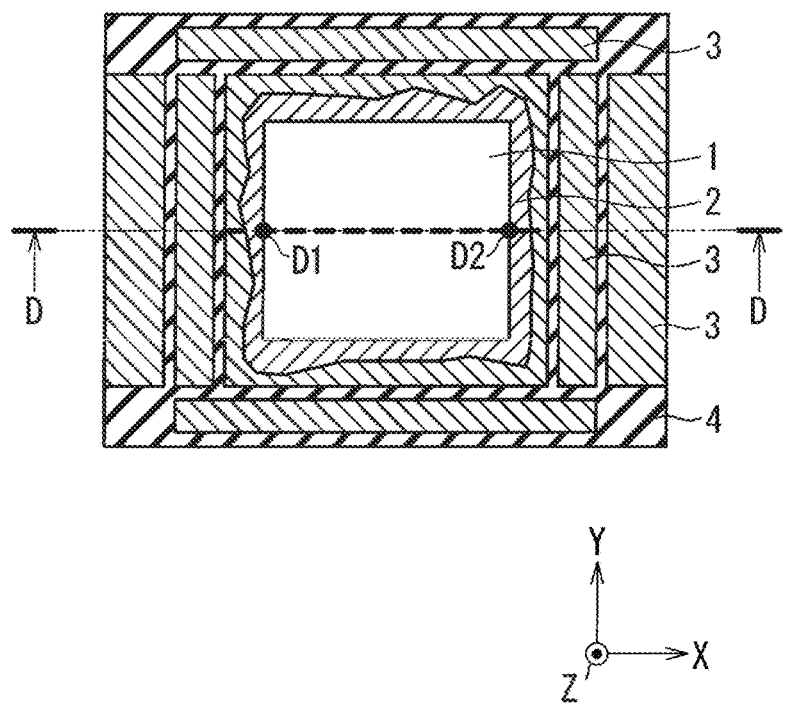
FIG. 9 An explanation diagram illustrating the method of manufacturing the semiconductor device according to the embodiment 1.

Subsequently, the semiconductor element 1 and the DBC substrate 8 are joined via the solder joint portion 2 as illustrated in FIG. 8 and FIG. 9 in Step S4. FIG. 8 corresponds to a D-D cross section in FIG. 9.

That is to say, the solder sheet 20 is heated and melted in Step S4. The melted solder sheet 20 after execution of Step S4 becomes the solder joint portion 2, and a surface of the DBC substrate 8 and the rear surface of the semiconductor element 1 are joined via the solder joint portion 2.

In a solder joint process executed in Step S4, a thermal treatment is performed at a temperature of 180° C. for ten minutes under general formic acid atmosphere as an organic acid capable of reducing and removing a metal oxide film, and then a thermal treatment is performed at a temperature of 260° C. for five minutes. In a case of not the solder sheet 20 but the solder paste, flux as a reduction removal agent is already included, thus formic acid is not necessary, and the thermal treatment may be performed under $N_2$ atmosphere.

When flux has residual, an organic residual adhering to a surrounding of the solder joint portion 2 can be easily removed by wet cleaning. When flux has no residual, cleaning is unnecessary.

Figure 14:
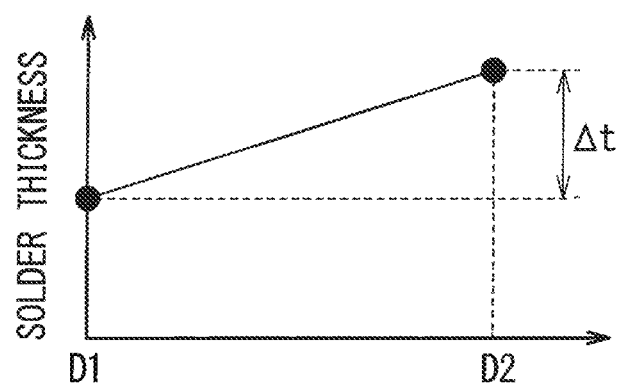
FIG. 14 A graph illustrating a variation of a thickness of a solder joint portion.

FIG. 14 is a graph illustrating a variation of a thickness of a solder joint portion 2 obtained after execution of Step S4. FIG. 14 illustrates a film thickness displacement of the solder joint portion in a Z direction between points D1 and D2 along an X direction illustrated in FIG. 9 as a film thickness difference Δt.

The film thickness difference Δt illustrated in FIG. 14 indicates a variation of the film thickness of the solder joint portion 2 measured from a center of the semiconductor element 1 with a laser displacement meter and calculated based on an assumption that the semiconductor element 1 has a uniform thickness. When a film thickness in the point D1 is T1, and a film thickness in the point D2 is T2, the film thickness difference Δt is expressed by the following expression (1).

$$\Delta t = |T1 - T2| \ (\mu m) \quad (1)$$

In the expression (1), |Y| indicates an absolute value of Y.

Figure 10:
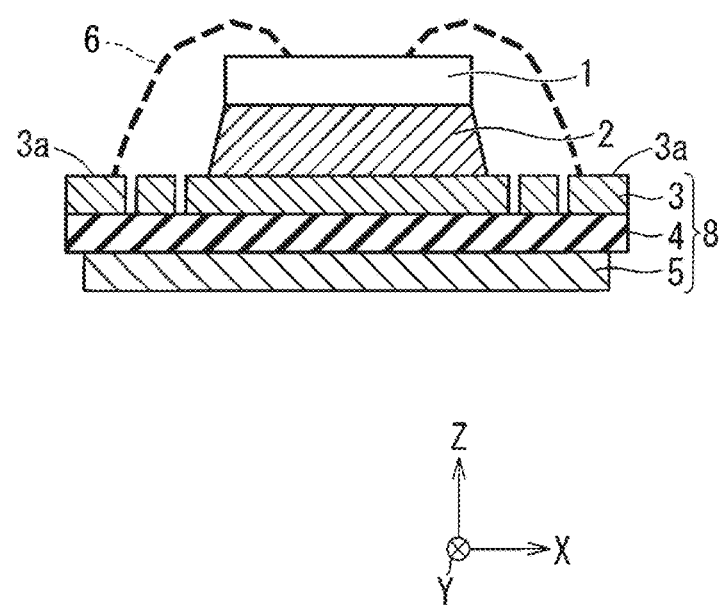
FIG. 10 An explanation diagram illustrating the method of manufacturing the semiconductor device according to the embodiment 1.
Figure 11:
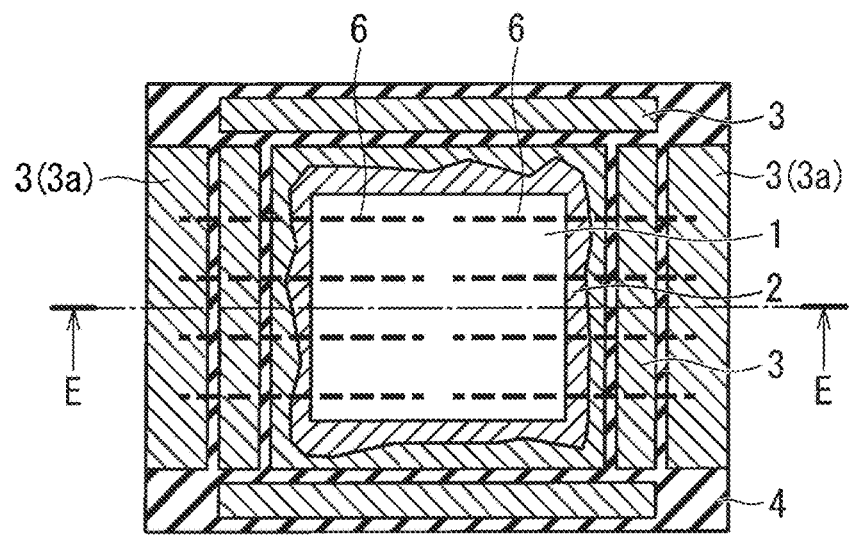
FIG. 11 An explanation diagram illustrating the method of manufacturing the semiconductor device according to the embodiment 1.
Figure 11:
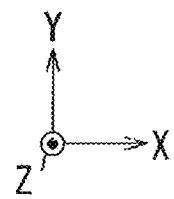

Next, in Step S5, the plurality of metal wires 6 are formed as illustrated in FIG. 10 and FIG. 11. FIG. 10 corresponds to an E-E cross section in FIG. 11. The plurality of metal wires 6 are illustrated by broken line for convenience in illustration in the drawings, but are continuously formed as a matter of course.

Each of the plurality of metal wires 6 has a wire diameter of 150 μm, and Al is used for a constituent material thereof. At a time of execution of Step S5, one end of each of the plurality of metal wires 6 is joined to the front surface of the semiconductor element 1, and the other end of each of the plurality of metal wires 6 is joined to the connection region 3a in the upper electrode 3 of the DBC substrate 8.

A material other than Al is also applicable as the constituent material of the metal wire 6. For example, considered as the constituent material of the metal wire 6 is Al alloy including Al as a main component, Cu, Cu alloy including Cu as a main component, or a Cu/Al clad wire cladded with Cu and Al.

The front surface of the semiconductor element 1 and one end of the metal wire 6 are joined, and the upper electrode 3 of the DBC substrate 8 and the other end of the metal wire 6 are joined using ultrasonic joint method of applying ultrasonic wave and load. When an electrical connection relationship is secured between the semiconductor element 1 and the upper electrode 3, and the surface metal film of the semiconductor element 1 and a member such as the upper electrode 3 of the DBC substrate 8 are not broken, a joint method other than the ultrasonic joint method can be optionally adopted as the joint method of joining the metal wire 6.

The wire diameter of the metal wire 6 is also a design manner, thus can be optionally adjusted. In the embodiment 2, the plurality of metal wires 6 are provided at an interval of 2.5 mm along the Y direction as a second direction on the semiconductor element 1 having a chip size of 10 mm×10 mm. The X direction is an extension direction of each of the plurality of metal wires 6. That is to say, an arrangement direction of the plurality of metal wires 6 is the X direction as a first direction.

Figure 12:
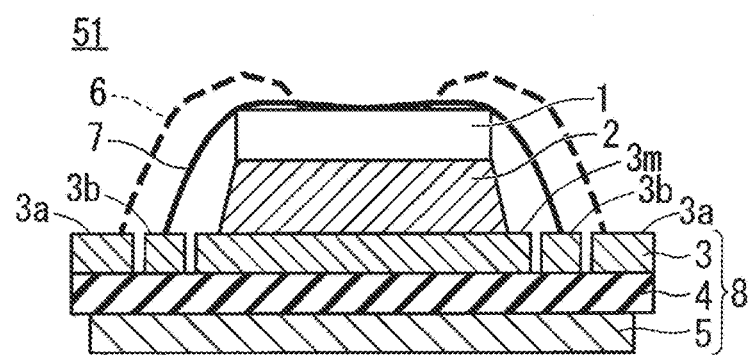
FIG. 12 An explanation diagram illustrating the method of manufacturing the semiconductor device according to the embodiment 1.
Figure 12:
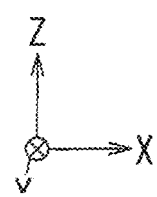
Figure 13:
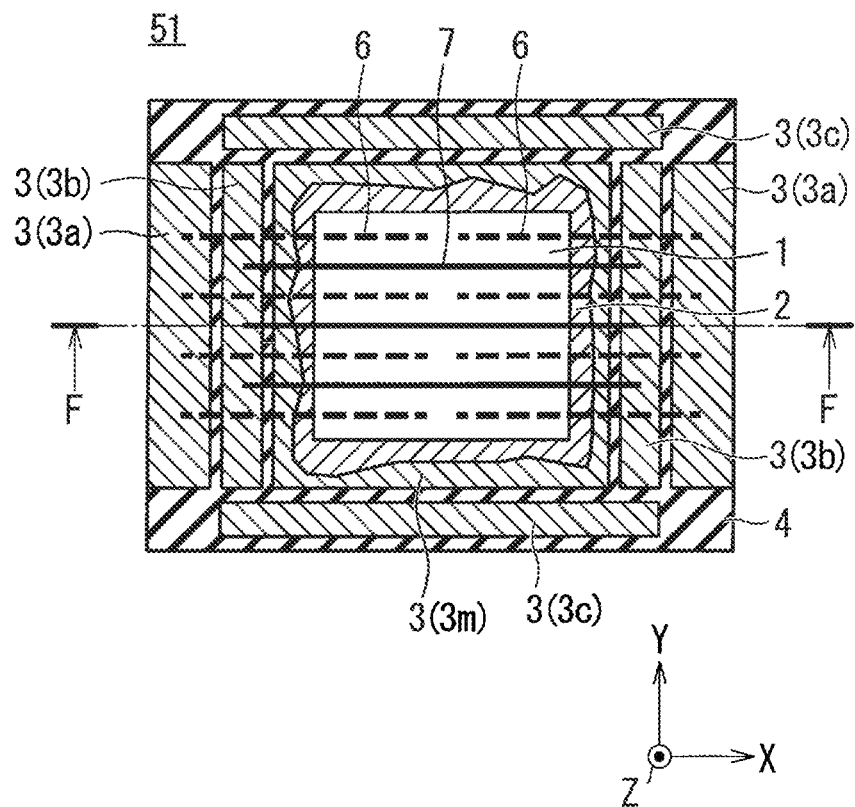
FIG. 13 An explanation diagram illustrating the method of manufacturing the semiconductor device according to the embodiment 1.

Subsequently, in Step S6, the plurality of insulation covering wires 7 are formed independently from the plurality of metal wires 6 as illustrated in FIG. 12 and FIG. 13. FIG. 12 corresponds to an F-F cross section in FIG. 13. Each of the plurality of insulation covering wires 7 has the same structure including a constituent material.

Figures 15, 16:
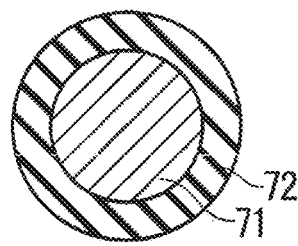
FIG. 15 A cross-sectional view illustrating a cross-sectional structure of an insulation covering wire in FIG. 12 and FIG. 13.
FIG. 16 An explanation diagram illustrating an effect of embodiments in a table form.

FIG. 15 is a cross-sectional view illustrating an example of a cross-sectional structure of the insulation covering wire 7. As illustrated in FIG. 15, the insulation covering wire 7 includes a wire portion 71 and an insulation covering portion 72 provided to cover an outer periphery of the wire portion 71 as main constituent elements.

Cu is used as a constituent material of the wire portion 71 in the insulation covering wire 7, and a wire diameter of the wire portion 71 is 150 μm.

In addition to Cu, any of Al, Fe, Ti, Ni, and Cr is also applicable as the constituent material of the wire portion 71. Required for the wire portion 71 is a function of suppressing increase in joint thickness occurring at the time of longitudinal crack of the solder joint portion 2.

Accordingly, the wire portion 71 needs to satisfy a yield stress requirement to have yield stress calculated by a tension test method regulated by international standard ISO 6892-1 higher than the constituent material of the solder joint portion 2 in a temperature range of 25° C. to 150° C. That is to say, when the wire portion 71 of each of the plurality of insulation covering wire 7 satisfies the yield stress requirement described above under an operation environment of the semiconductor element 1 regulated in a temperature range of 25° C. to 150° C., increase in the solder thickness in the solder joint portion 2 can be suppressed.

In the meanwhile, an F type resin insulating film having high heat resistance is used as a constituent material of the insulation covering portion 72, and a film thickness thereof is set to 10 μm. Any of F type, H type, N type, and R type regulated by international standard IEC 60085 is applicable as a heat resistance type of the insulating film in the resin insulating film as a constituent material of the insulation covering portion 72.

In the regulation of international regulation IEC 60085, an allowable maximum temperature of F type is 155° C., an allowable maximum temperature of H type is 180° C., and an allowable maximum temperature of R type is 220° C.

At the time of execution of Step S6, in the plurality of insulation covering wires 7, the insulation covering portion 72 in a center region has contact with the front surface of the semiconductor element 1, and one end and the other end are joined to the connection region 3b in the upper electrode 3 of the DBC substrate 8 over the semiconductor element 1. Specifically, one end of each of the plurality of insulation covering wires 7 is joined to the connection region 3b on a −X side, and the other end thereof is joined to the connection region 3b on a +X side in two connection regions 3b and 3b located separately on the −X side and the +X side.

At this time, the plurality of insulation covering wires 7 are provided with no loosening, thus have press force of pressing the semiconductor element 1 in a direction of the solder joint portion 2.

Furthermore, the plurality of insulation covering wires 7 are provided along the X direction as the first direction, and are provided not to be overlapped with the plurality of metal wires 6 in a plan view. Specifically, one insulation covering wire 7 is disposed between two metal wires 6 and 6 disposed in the Y direction. In this manner, the plurality of insulation covering wires 7 are provided independently from the plurality of metal wires 6, and the plurality of insulation covering wires 7 and the plurality of metal wires 6 are not electrically connected to each other.

One end and the other end of the insulation covering wire 7 are fixed to the DBC substrate 8 over the semiconductor element 1 by getting the insulation covering portion 72 on the surface outside by ultrasonic energy in the ultrasonic joint method and joining the wire portion 71 and the connection region 3b by a metal diffusion joining.

The semiconductor device 51 according to the embodiment 1 is completed after execution of Step S6.

Figure 21:
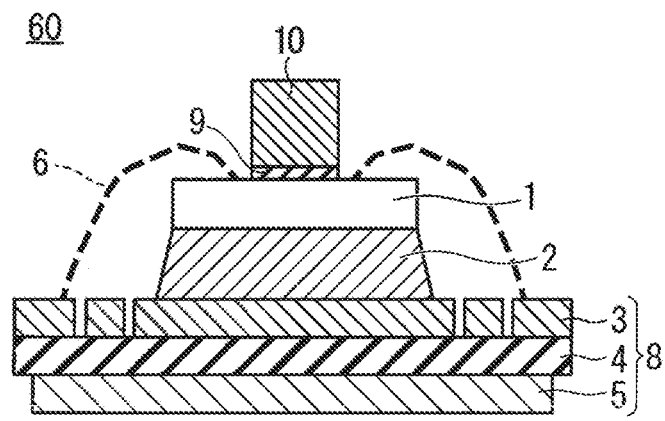
FIG. 21 An explanation diagram illustrating a structure of a comparison semiconductor device.
Figure 21:
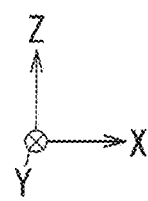
Figure 22:
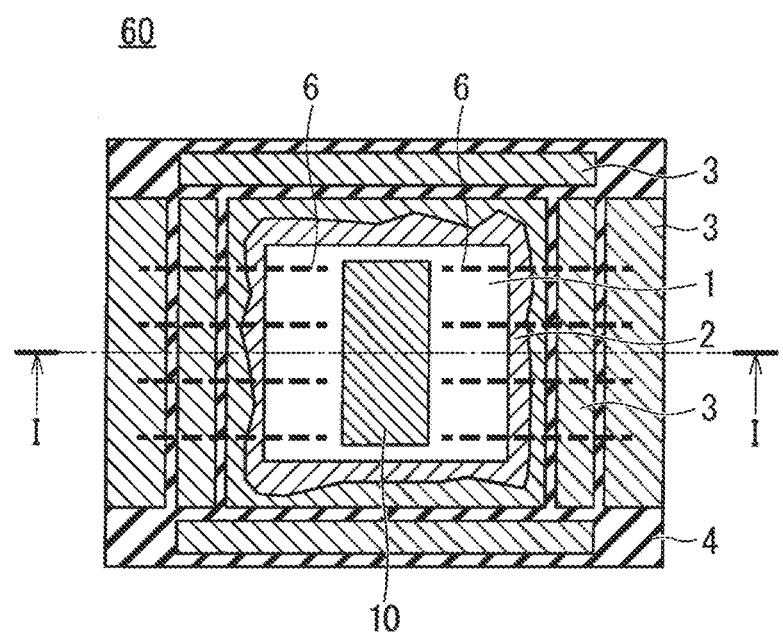
FIG. 22 An explanation diagram illustrating a structure of the comparison semiconductor device.
Figure 22:
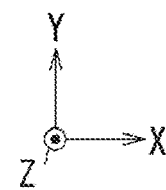

FIG. 16 is an explanation diagram illustrating an effect of embodiments in a table form. FIG. 21 and FIG. 22 are explanation diagrams each illustrating a structure of a comparison semiconductor device 60 as a comparison technique. FIG. 21 is a cross-sectional view, and FIG. 22 is a plan view. FIG. 21 corresponds to an I-I cross section in FIG. 22. An XYZ rectangular coordinate system is illustrated in FIG. 21 and FIG. 22.

As illustrated in FIG. 21 and FIG. 22, the comparison semiconductor device 60 is different from the semiconductor device 51 according to the embodiment 1 in that it does not include the insulation covering wire 7 but includes an insulating film 9 and a copper block 10.

The insulating film 9 does not have contact with the plurality of metal wires 6 but is provided on the front surface of the semiconductor element 1, and the copper block 10 is provided on the insulating film 9. The solder joint portion 2 is adopted as the press member in the copper block 10.

FIG. 16 illustrates an experimental result of a case where a power cycle test is performed on the semiconductor device including plural types of the solder joint portions 2 each having a film thickness difference Δt different from each other illustrated in FIG. 14 by "good" and "fault".

FIG. 16 illustrates an experimental result of a case where the film thickness differences Δt of the solder joint portions 2 are 5, 8, 33, 52, 78, and 90 (μm), respectively.

A power cycle test is performed on the comparison semiconductor device 60, the semiconductor device 51 according to the embodiment 1, and a semiconductor device 52 according to an embodiment 2 described hereinafter so that a joint portion temperature of the solder joint portion 2 at the time of turning current on in the semiconductor element 1 is 150° C. and a joint portion temperature of the solder joint portion 2 at the time of turning current off in the semiconductor element 1 is 80° C. That is to say, each voltage and current are adjusted to satisfy ΔT=70° C. (150° C.−80° C.), and a fifty thousand cycle test is performed on the semiconductor device 51 at a constant supply power.

In FIG. 16, a case where an operation temperature is lower than 155° C. which is set to be higher than 150° C. by 5° C. after the fifty thousand cycle test is determined as "good" and a case where the operation temperature is higher than 155° C. is determined as "fault."

As illustrated in FIG. 16, in the comparison semiconductor device 60 using the copper block 10 as the press member, initial connectivity is unstable when a variation of a thickness larger than Δt=5 μm occurs, thus the comparison semiconductor device 60 generates high heat and is determined as "fault". A cause thereof is considered that a solid material such as the copper block 10 cannot follow the variation of the thickness of the solder joint portion 2, thus the copper block 10 has a small effect of pressing, and a partial contact state occurs.

In the meanwhile, in the semiconductor device 51 described in the embodiment 1, press force by the plurality of insulation covering wires 7 acts on each position of the solder joint portion 2, thus a favorable effect is obtained in a whole range where the variation of the thickness occurs in the solder joint portion 2.

It is also applicable that a cross-sectional shape of the wire portion 71 of the insulation covering wire 7 is not a circular shape as illustrated in FIG. 15 but a rectangular shape. That is to say, even when a rectangular wire is adopted as the insulation covering wire 7, achievable is press force similar to that in the case where the cross-sectional shape of the insulation covering wire 7 is the circular shape.

(Effect)

The semiconductor device 51 according to the embodiment 1 is manufactured by executing Steps S1 to S6 in FIG. 1. The plurality of insulation covering wires 7 in the semiconductor device 51 have the press force of pressing the semiconductor element 1 in the direction of the solder joint portion 2.

Thus, the semiconductor device 51 according to the embodiment 1 has an effect that increase in a film thickness caused by a longitudinal crack of the solder joint portion 2 can be suppressed. This effect can effectively suppress a defect of occurrence of heat generation phenomenon in the semiconductor element 1 when the film thickness of the solder joint portion 2 is not uniform.

As a result, the semiconductor device 51 according to the embodiment 1 is capable of securing high joint reliability in the solder joint portion 2.

Each of the plurality of insulation covering wires 7 has a structure that the insulating covering portion 72 covers an outer periphery of the wire portion 71. Thus, even when the plurality of insulation covering wires 7 have contact with the front surface of the semiconductor element 1, the semiconductor element 1 and the wire portion 71 are not electrically connected to each other.

Accordingly, in the semiconductor device 51 according to the embodiment 1, the plurality of insulation covering wires 7 do not have an influence on an operation of the semiconductor element 1.

In addition, the plurality of insulation covering wires 7 each having the wire portion 71 and the insulation covering portion 72 are relatively small constituent elements, thus downsizing of the device can be achieved in the semiconductor device 51.

In the semiconductor device 51 according to the embodiment 1, the plurality of insulation covering wires 7 are not overlapped with the plurality of metal wires 6 in a plan view. Thus, the semiconductor device 51 can apply the press force described to each of the plurality of insulation covering wires 7 without having a negative influence caused by contact between the plurality of insulation covering wires 7 and the plurality of metal wires 6.

The connection region 3a as the first connection region and the connection region 3b as the second connection region are electrically independent from each other in the upper electrode 3 of the DBC substrate 8. Thus, even when one end of each of the plurality of metal wires 6 and one end and the other end of each of the plurality of insulation covering wires 7 are commonly connected to the upper electrode 3 in the semiconductor device 51, the plurality of insulation covering wires 7 do not bring about obstacles to the operation of the semiconductor element 1.

The wire portion 71 of each insulation covering wire 7 satisfies a yield stress requirement to have yield stress higher than the solder joint portion 2 under an operation environment of the semiconductor element 1 regulated in a temperature range of 25° C. to 150° C.

Thus, the semiconductor device 51 according to the embodiment 1 can suppress increase in the film thickness of the solder joint portion without troubles by the press force of each of the plurality of insulation covering wires 7 when the semiconductor element 1 is operated in the temperature range of 25° C. to 150° C.

When the semiconductor element 1 is an SiC device, the yield stress requirement described above needs to be satisfied under the operation environment of the semiconductor element 1 regulated in a temperature range higher than 150° C.

A constituent material of the wire portion 71 includes at least one of Aluminum (Al), copper (Cu), iron (Fe), titanium (Ti), nickel (Ni), and chrome (Cr), thus can satisfy the yield stress requirement described above.

The insulation covering portion 72 in each insulation covering wire 7 is a heat resistance type, thus even when the semiconductor element 1 is operated in the temperature range described above, increase in the film thickness of the solder joint portion 2 can be suppressed without troubles by the press force of each of the plurality of insulation covering wires 7 without detachment of the insulation covering portion 72.

Embodiment 2

Figure 17:
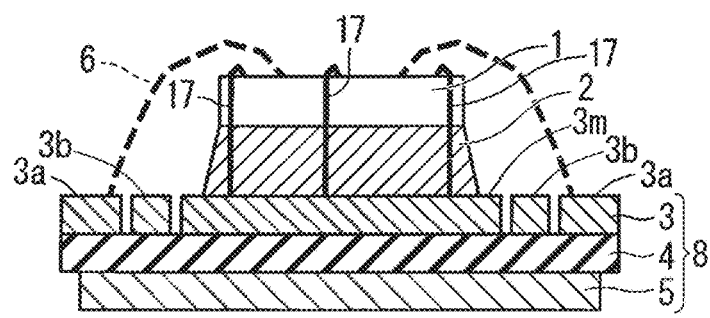
FIG. 17 An explanation diagram illustrating a structure of a semiconductor device as an embodiment 2.
Figure 17:
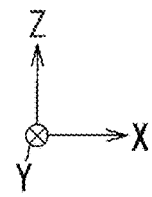
Figure 18:
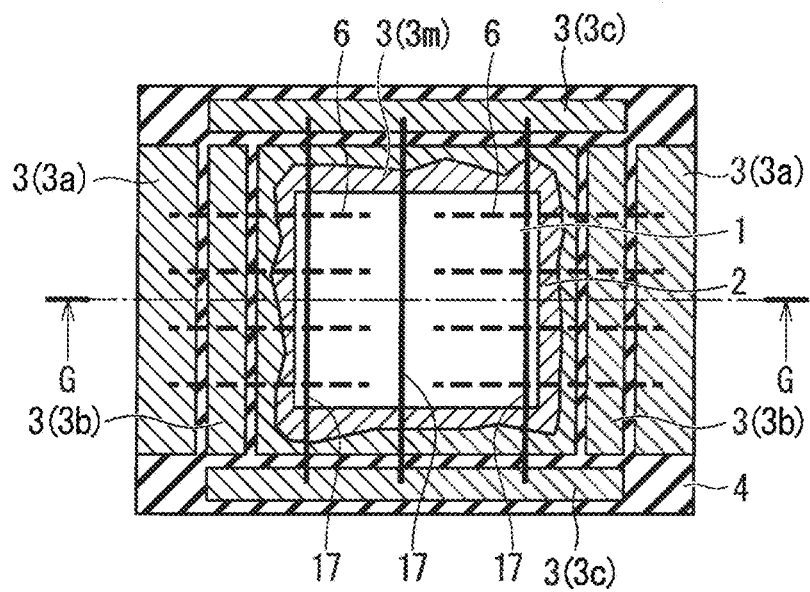
FIG. 18 An explanation diagram illustrating a structure of the semiconductor device as the embodiment 2.
Figure 18:
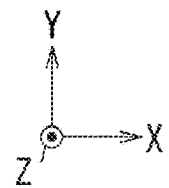

FIG. 17 and FIG. 18 are explanation diagrams each illustrating a structure of a semiconductor device 52 as the embodiment 2 according to the present disclosure. FIG. 17 is a cross-sectional view illustrating a cross-sectional structure of the semiconductor device 52, and FIG. 18 is a plan view illustrating a planar structure of the semiconductor device 52. FIG. 17 corresponds to a G-G cross section in FIG. 18. An XYZ rectangular coordinate system is illustrated in FIG. 17 and FIG. 18.

The description of a configuration similar to that in the semiconductor device 51 according to the embodiment 1 is appropriately omitted in the structure of the semiconductor device 52 according to the embodiment 2, and a characterizing portion of the embodiment 2 is mainly described hereinafter.

Each of the plurality of insulation covering wires 17 has the same structure including a constituent material, and a cross-sectional structure of the insulation covering wire 17 includes the wire portion 71 and the insulation covering portion 72 as main constituent elements in the manner similar to the insulation covering wire 7 as illustrated in FIG. 15. Constituent elements of the wire portion 71 and the insulation covering portion 72 of the insulation covering wire 17 are also similar to those of the insulation covering wire 7.

As illustrated in FIG. 17 and FIG. 18, in the plurality of insulation covering wires 17, the insulation covering portion 72 in the center region has contact with the front surface of the semiconductor element 1, and one end and the other end are joined to the connection region 3b in the upper electrode 3 of the DBC substrate 8 over the semiconductor element 1. Specifically, one end of each of the plurality of insulation covering wires 17 is joined to the connection region 3c on a +Y side, and the other end thereof is joined to the connection region 3c on a −Y side in the two connection regions 3c and 3c located separately on the +Y side and the −Y side.

The plurality of insulation covering wires 17 are provided with no loosening, thus have press force of pressing the semiconductor element 1 in the direction of the solder joint portion 2 in the manner similar to the plurality of insulation covering wires 7.

Furthermore, the plurality of insulation covering wires 17 are provided along the Y direction intersecting with the X direction at right angle. Herein, the X direction is the first direction, and the Y direction is the second direction.

However, the plurality of insulation covering wires 17 are provided without having a connection relationship with the plurality of metal wires 6. Specifically, as illustrated in FIG. 17, each position in the plurality of metal wires 6 intersecting with any of the plurality of insulation covering wires 17 is provided to be located above with a space from the corresponding insulation covering wire 17. In this manner, the plurality of insulation covering wires 17 are provided independently from the plurality of metal wires 6, and the plurality of insulation covering wires 17 and the plurality of metal wires 6 are not electrically connected to each other.

One end and the other end of the insulation covering wire 17 are fixed to the DBC substrate 8 over the semiconductor element 1 by getting the insulation covering portion 72 on the surface outside by ultrasonic energy in the ultrasonic joint method and joining the wire portion 71 and the connection region 3c by a metal diffusion joining, for example.

A method of manufacturing the semiconductor device 52 according to the embodiment 2 is similar to that of the semiconductor device 51 according to the embodiment 1 from Steps S1 to S5.

The semiconductor device 52 according to the embodiment 2 is completed by executing a process of forming the plurality of insulation covering wires 17 as Step S6 in place of the plurality of insulation covering wires 7.

In the semiconductor device 52 described in the embodiment 2, press force by the plurality of insulation covering wires 17 acts on each position of the solder joint portion 2, thus a favorable effect is obtained in a whole range where the variation of the thickness occurs in the solder joint portion 2 in the manner similar to the semiconductor device 51 according to the embodiment 1.

It is also applicable that a cross-sectional shape of the wire portion 71 of the insulation covering wire 17 is not a circular shape as illustrated in FIG. 15 but a rectangular shape. That is to say, even when a rectangular wire is adopted as the insulation covering wire 17, achievable is press force similar to the case where the cross-sectional shape of the insulation covering wire 17 is the circular shape.

(Effect)

The semiconductor device 52 according to the embodiment 2 is manufactured via Steps S1 to S5 in FIG. 1 and the process of forming the plurality of insulation covering wires 17. The plurality of insulation covering wires 17 in the semiconductor device 52 have the press force of pressing the semiconductor element 1 in the direction of the solder joint portion 2.

Thus, the semiconductor device 52 according to the embodiment 2 has an effect that increase in a film thickness caused by a longitudinal crack of the solder joint portion 2 can be suppressed in the manner similar to the embodiment 1.

As a result, the semiconductor device 52 according to the embodiment 2 is capable of securing high joint reliability in the solder joint portion 2.

Each of the plurality of insulation covering wires 17 has a structure that the insulating covering portion 72 covers an outer periphery of the wire portion 71. Thus, even when the plurality of insulation covering wires 17 have contact with the front surface of the semiconductor element 1, the semiconductor element 1 and the wire portion 71 are not electrically connected to each other.

Accordingly, in the semiconductor device 52 according to the embodiment 2, the plurality of insulation covering wires 17 do not have an influence on an operation of the semiconductor element 1.

In addition, the plurality of insulation covering wires 17 each having the wire portion 71 and the insulation covering portion 72 are relatively small constituent elements, thus downsizing of the device can be achieved in the semiconductor device 52.

In the semiconductor device 52, the plurality of insulation covering wires 17 do not have a connection relationship with the plurality of metal wires 6, thus can apply the press force described above to each of the plurality of insulation covering wires 17 without having a negative influence caused by contact between the plurality of insulation covering wires 17 and the plurality of metal wires 6.

The connection region 3a as the first connection region and the connection region 3c as the second connection region are electrically independent from each other in the upper electrode 3 of the DBC substrate 8. Thus, even when one end of each of the plurality of metal wires 6 and one end and the other end of each of the plurality of insulation covering wires 17 are commonly connected to the upper electrode 3 in the semiconductor device 52, the plurality of insulation covering wires 17 does not bring about obstacles to the operation of the semiconductor element 1.

Furthermore, the insulation covering wire 17 is made up of the wire portion 71 and the insulation covering portion 72 in the same manner as the insulation covering wire 7.

Thus, the semiconductor device 52 according to the embodiment 2 can have the effect on the wire portion 71 and the insulation covering portion 72 in the manner similar to the semiconductor device 51 according to the embodiment 1.

Embodiment 3

Figure 19:
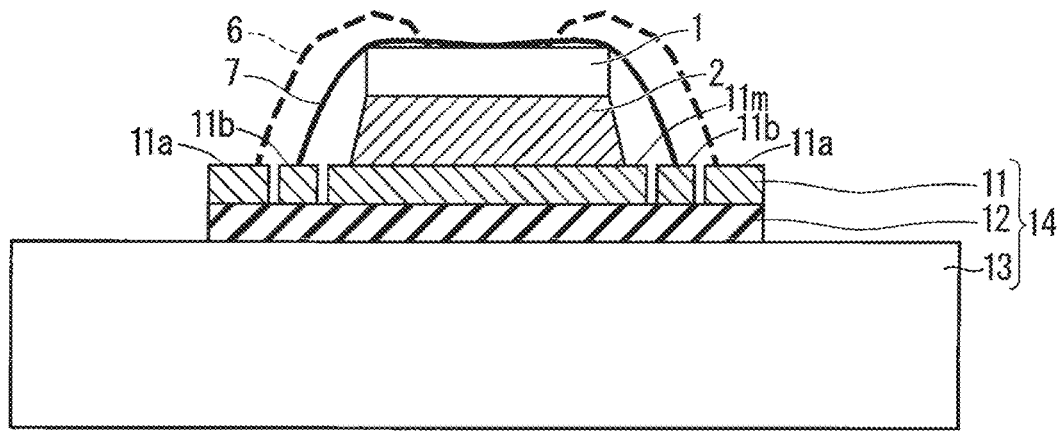
FIG. 19 An explanation diagram illustrating a structure of a semiconductor device as an embodiment 3.
Figure 19:
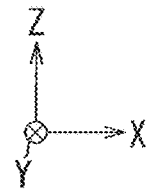
Figure 20:
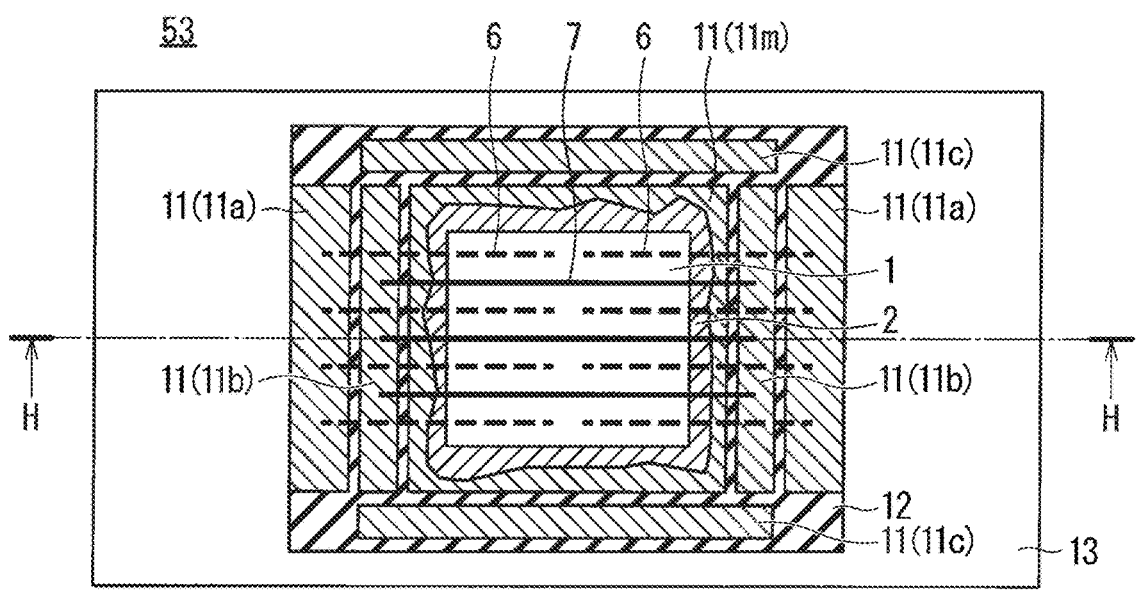
FIG. 20 An explanation diagram illustrating a structure of the semiconductor device as the embodiment 3.
Figure 20:
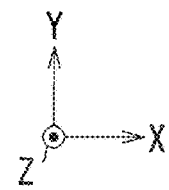

FIG. 19 and FIG. 20 are explanation diagrams each illustrating a structure of a semiconductor device 53 as the embodiment 3. FIG. 19 is a cross-sectional view illustrating a cross-sectional structure of the semiconductor device 53, and FIG. 20 is a plan view illustrating a planar structure of the semiconductor device 53. FIG. 19 corresponds to an H-H cross section in FIG. 20. An XYZ rectangular coordinate system is illustrated in FIG. 19 and FIG. 20.

In the structure of the semiconductor device 53, the same sign is assigned to a configuration similar to that in the semiconductor device 51 and the description is appropriately omitted, and then a characterizing portion of the embodiment 3 is mainly described hereinafter.

The semiconductor device 53 according to the embodiment 3 has a feature that the DBC substrate 8 in the semiconductor device 51 according to the embodiment 1 is replaced with an integrated substrate 14.

The integrated substrate 14 as a substrate for the semiconductor element 1 includes an upper electrode 11, an insulation base body 12, and a heat radiation plate 13 as main constituent elements. The upper electrode 11 is provided on an upper surface of the insulation base body 12, and the heat radiation plate 13 is provided on a lower surface of the insulation base body 12.

A constituent material and a structure of the upper electrode 11 are similar to those of the upper electrode 3 of the DBC substrate 8. A constituent material and a structure of the insulation base body 12 are similar to those of the insulation base body 4 of the DBC substrate 8.

The heat radiation plate 13 has conductivity as "a lower electrode" in a broad sense in the manner similar to the lower electrode 5 of the DBC substrate 8.

However, the heat radiation plate 13 is different from the lower electrode 5 of the DBC substrate 8 in that it has an upper surface wider than the lower surface of the insulation base body 12 and has a film thickness larger than the insulation base body 12.

A pattern is formed on the upper electrode 11 of the integrated substrate 14 in the manner similar to that of the upper electrode 3 of the DBC substrate 8.

The patterned upper electrode 11 includes a main region 11m and connection regions 11a to 11c. In a relationship between the upper electrode 11 and the upper electrode 3, the main region 11 corresponds to the main region 3m, and the connection regions 11a to 11c correspond to the connection regions 3a to 3c.

The main region 11m is a region joined to the semiconductor element 1 via the solder joint portion 2. The connection region 11a and the connection region 11b are electrically independent from each other between the connection regions 11a to 11c, and the connection region 11a and the connection region 11c are electrically independent from each other. The connection region 11a is classified into the first connection region electrically connected to an external terminal for actual use, and the connection regions 11b and 11c are classified into the second connection regions for joining an insulation covering wire 7 and the insulation covering wire 17.

Accordingly, the connection region 11b and the connection region 11c classified into the second connection regions are not electrically connected to the external terminal for actual use, and current does not flow in the insulation covering wire 7 and the insulation covering wire 17.

As illustrated in FIG. 19 and FIG. 20, in the plurality of insulation covering wires 7, the insulation covering portion 72 in the center region has contact with the front surface of the semiconductor element 1, and one end and the other end are joined to the connection region 11b in the upper electrode 11 of the integrated substrate 14 over the semiconductor element 1. Specifically, one end of each of the plurality of insulation covering wires 7 is joined to the connection region 11b on the –X side, and the other end thereof is joined to the connection region 11b on the +X side in two connection regions 11b and 11b located separately on the –X side and the +X side.

The plurality of insulation covering wires 7 are provided with no loosening, thus have press force of pressing the semiconductor element 1 in the direction of the solder joint portion 2.

Furthermore, the plurality of insulation covering wires 7 are provided along the X direction as the first direction, and are provided not to be overlapped with the plurality of metal wires 6 in a plan view. In this manner, the plurality of insulation covering wires 7 are provided independently from the plurality of metal wires 6, and the plurality of insulation covering wires 7 and the plurality of metal wires 6 are not electrically connected to each other.

One end and the other end of the insulation covering wire 7 are fixed to the integrated substrate 14 over the semiconductor element 1 by getting the insulation covering portion 72 on the surface outside by ultrasonic energy in the ultrasonic joint method and joining the wire portion 71 and the connection region 11b by a metal diffusion joining.

A method of manufacturing the semiconductor device 53 according to the embodiment 3 is performed in the manner similar to that of the semiconductor device 51 according to the embodiment 1 except that the DBC substrate 8 is replaced with the integrated substrate 14.

Accordingly, after the process similar to Steps S1 to S5 illustrated in FIG. 1, executed is a process of forming the plurality of insulation covering wires 7 to be joined to the integrated substrate 14 as Step S6, thus the semiconductor device 53 according to the embodiment 3 can be manufactured.

It is also applicable that a cross-sectional shape of the wire portion 71 of the insulation covering wire 7 is not a circular shape as illustrated in FIG. 15 but a rectangular shape. That is to say, even when a rectangular wire is adopted as the insulation covering wire 7, achievable is press force similar to the case where the cross-sectional shape of the insulation covering wire 7 is the circular shape.

(Effect)

The semiconductor device 53 according to the embodiment 3 is manufactured via Steps S1 to S6 similar to that in the embodiment 1. The plurality of insulation covering wires 7 in the semiconductor device 53 have the press force of pressing the semiconductor element 1 in the direction of the solder joint portion 2.

Thus, the semiconductor device 53 according to the embodiment 3 has an effect that increase in a film thickness caused by a longitudinal crack of the solder joint portion 2 can be suppressed in the manner similar to the embodiment 1 and the embodiment 2.

As a result, the semiconductor device 53 according to the embodiment 3 is capable of securing high joint reliability in the solder joint portion 2.

Accordingly, it is assumed that a result similar to that of the embodiment 1 and the embodiment 2 is obtained also in a power cycle test illustrated in FIG. 16.

Furthermore, in the semiconductor device 53 according to the embodiment 5, the heat radiation plate 13 functioning as a lower electrode of the integrated substrate 14 has an upper surface wider than the lower surface of the insulation base body 12 and has a film thickness larger than the insulation base body 12.

Thus, in the semiconductor device 53, the integrated substrate 14 itself having the heat radiation plate 13 can have a sufficient heat radiation function. Accordingly, a heat radiation member needs not be provided outside the semiconductor device 53.

The semiconductor device 53 according to the embodiment 3 includes the plurality of insulation covering wires 7 having substantially the same feature as that in the embodiment 1, thus have an effect similar to the embodiment 1 on the plurality of insulation covering wires 7.

The connection region 11a as the first connection region and the connection region 11b as the second connection region are electrically independent from each other in the upper electrode 11 of the integrated substrate 14 of the semiconductor device 53. Thus, even when one end of each of the plurality of metal wires 6 and one end and the other end of each of the plurality of insulation covering wires 7 are commonly connected to the upper electrode 11 in the semiconductor device 53, the plurality of insulation covering wires 7 do not bring about obstacles to the operation of the semiconductor element 1.

The plurality of insulation covering wires 7 of the semiconductor device 53 may be replaced with the insulation covering wires 17 according to the embodiment 2. That is to say, it is also applicable that the plurality of insulation covering wires 17 are joined between the connection regions 11c and 11c of the upper electrode 11 in the manner similar to the embodiment 2 in place of the plurality of insulation covering wires 7.

According to the present disclosure, each embodiment can be arbitrarily combined, or each embodiment can be appropriately varied or omitted within the scope of the disclosure.

The invention claimed is:

1. A semiconductor device, comprising:
   a substrate; and
   a semiconductor element provided on the substrate via a solder joint portion, wherein
   the substrate and the semiconductor element are joined by the solder joint portion,
   the semiconductor device further comprising:
   a metal wire including one end connected to the semiconductor element and another end connected to the substrate; and
   an insulation covering wire including a wire portion and an insulation covering portion provided to cover the wire portion, provided independently from the metal wire, and having one end and another end connected to the substrate over the semiconductor element, wherein
   the insulation covering wire is provided in a form that the insulation covering portion has contact with a surface of the semiconductor element, and has press force of pressing the semiconductor element in a direction of the solder joint portion.

2. The semiconductor device according to claim 1, wherein
   the metal wire includes a plurality of metal wires each provided along a first direction,
   the insulation covering wire includes a plurality of insulation covering wires each provided along the first direction, and
   the plurality of insulation covering wires are not overlapped with the plurality of metal wires in a plan view.

3. The semiconductor device according to claim 1, wherein
   the metal wire includes a plurality of metal wires each provided along a first direction,
   the insulation covering wire includes a plurality of insulation covering wires each provided along a second direction intersecting with the first direction, and
   the plurality of insulation covering wires do not have a connection relationship with the plurality of metal wires.

4. The semiconductor device according to claim 1, wherein
   the substrate includes:
   an insulation base body; and
   an upper electrode provided on an upper surface of the insulating base body,
   the upper electrode includes a first connection region and a second connection region,
   another end of the metal wire is connected to the first connection region of the upper electrode, one end and another end of the insulation covering wire is connected to the second connection region of the upper electrode, and the first connection region and the second connection region are electrically independent from each other.

5. The semiconductor device according to claim 4, wherein the substrate further includes a heat radiation plate provided on a lower surface of the insulation base body, and the heat radiation plate includes an upper surface wider than the lower surface of the insulation base body, and has a film thickness larger than the insulation base body.

6. The semiconductor device according to claim 1, wherein the wire portion of the insulation covering wire satisfies a yield stress requirement to have yield stress higher than the solder joint portion in an operation environment of the semiconductor element.

7. The semiconductor device according to claim 6, wherein a constituent material of the wire portion includes at least one of Al, Cu, Fe, Ti, Ni, and Cr.

8. The semiconductor device according to claim 1, wherein a heat resistance type of the insulation covering portion is any of F type, H type, N type, and R type regulated by international standard IEC 60085.

9. A method of manufacturing a semiconductor device, comprising steps of:

(a) preparing a substrate;

(b) placing a solder member on the substrate;

(c) placing a semiconductor element on the solder member;

(d) heating and melting the solder member, wherein the solder member after execution of the step (d) serves as a solder joint portion, and the substrate and the semiconductor element are joined via the solder joint portion;

(e) joining one end of a metal wire to the semiconductor element and joining another end of the metal wire to the substrate; and (f) joining, using an insulation covering wire including a wire portion and an insulation covering portion provided to cover the wire portion, one end and another end of the insulation covering wire to the substrate over the semiconductor element while the insulation covering portion has contact with a surface of the semiconductor element, wherein the insulation covering wire is independently formed from the metal wire, and the insulation covering wire after execution of the step (f) has press force of pressing the semiconductor element in a direction of the solder joint portion.

* * * * *